United States Patent [19]

Atsumi

[11] Patent Number: 5,181,092
[45] Date of Patent: Jan. 19, 1993

[54] INPUT PROTECTION RESISTOR USED IN INPUT PROTECTION CIRCUIT

[75] Inventor: Shigeru Atsumi, Tokyo, Japan

[73] Assignee: Kabushiki Kaisha Toshiba, Kawasaki, Japan

[21] Appl. No.: 672,933

[22] Filed: Mar. 21, 1991

[30] Foreign Application Priority Data

Mar. 22, 1990 [JP] Japan ................... 2-69722

[51] Int. Cl.$^5$ .......................................... H01L 29/78
[52] U.S. Cl. ............................. 257/361; 257/362; 257/363
[58] Field of Search ........................... 357/23.13

[56] References Cited

U.S. PATENT DOCUMENTS 4,920,445  4/1990  Jun ...................... 357/23.13
5,051,860  9/1991  Lee et al. .............. 357/23.13

FOREIGN PATENT DOCUMENTS 56-83964   9/1981  Japan .
59-4082    1/1984  Japan .
59-228751 12/1984  Japan .

OTHER PUBLICATIONS

C. Duvvury et al., "ESD Protection: Design and Layout Issues For VLSI Circuits", Conference Record of the 1987 IEEE Industry Application Society Annual Meeting Part II, Catalog Number 87CH2499-2.

Primary Examiner—John D. Lee
Assistant Examiner—Robert E. Wise
Attorney, Agent, or Firm—Banner, Birch, McKie & Beckett

[57] ABSTRACT

An input protection circuit includes an input protection resistor and an input protection element. The input protection resistor is connected at one end to an input pad and connected at the other end to the gate of a MOS transistor provided at the input stage of an internal circuit. The input protection element is connected between the gate of the MOS transistor and at least one of a ground terminal and a power source. The input protection resistor includes a first impurity diffused region of a second conductivity type formed in the main surface area of a semiconductor substrate of a first conductivity type, and a second impurity diffused region of the second conductivity type which is formed in the first impurity diffused region to have an impurity concentration higher than the first impurity diffused region and have a diffusion depth smaller than the first impurity diffused region.

19 Claims, 6 Drawing Sheets

INPUT PROTECTION RESISTOR USED IN INPUT PROTECTION CIRCUIT

BACKGROUND OF THE INVENTION

1. Field of the Invention

This invention relates to an input protection circuit for protecting the gate of a MOS (insulated gate type) transistor provided at the input stage of a semiconductor integrated circuit from electrostatic discharge (ESD) breakdown, and more particularly to the element structure of an input protection resistor constituting the input protection circuit.

2. Description of the Related Art

In a semiconductor integrated circuit device, ESD breakdown of an internal element caused by input of a surge voltage during the mounting operation by a user is a serious problem. The ESD breakdown is caused when an excessively high voltage is applied to an external pin of the semiconductor integrated circuit device.

Figure 1:
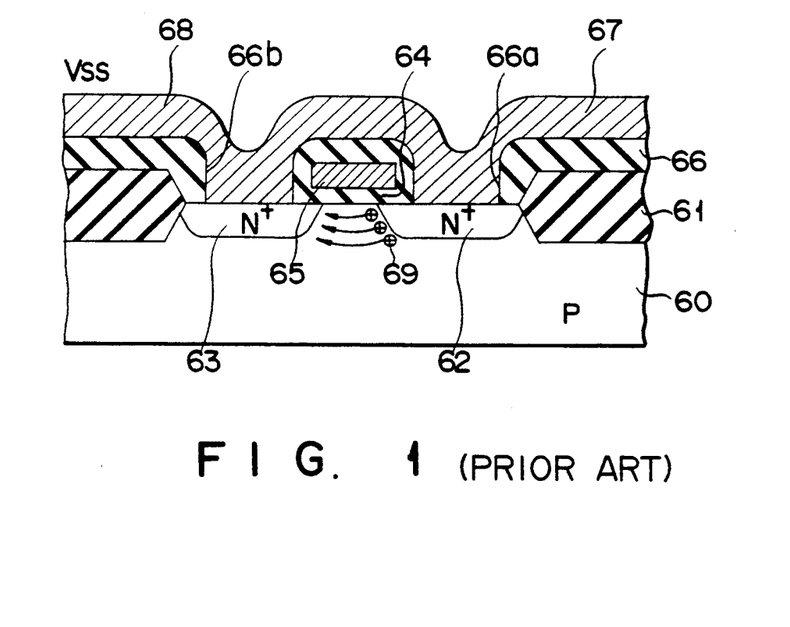
FIG. 1 is a cross sectional view showing the construction of an N-channel MOS transistor used as the conventional input protection element.

In order to prevent occurrence of the ESD breakdown, an input protection circuit is provided in the conventional MOS LSI (large scale integrated circuit). The input protection circuit is provided in a signal path extending from an input pad which is supplied with an input signal from the exterior of the LSI to the gate of a MOS transistor at the input stage of an internal circuit. That is, the drain of an N-channel MOS transistor (input protection transistor) serving as an input protection element is connected to the gate of the input-stage MOS transistor and the gate and source of the input protection transistor are connected to a ground terminal. FIG. 1 shows an example of the cross sectional structure of the input protection transistor. An element isolation region (field insulation film) 61 is selectively formed on the main surface of a P-type semiconductor substrate 60. A drain region (N+-type impurity diffused layer) 62 and a source region (N+-type impurity diffused layer) 63 are separately formed in the main surface area of the substrate 60 corresponding to an element region separated by the element isolation region 61. A gate insulation film 64 is formed on that portion of the substrate 60 which lies between the drain and source regions 62 and 63 and a gate electrode 65 is formed on the insulation film 64. An inter-level insulation film 66 is formed on the element isolation region 61 and the gate electrode 65. Contact holes 66a and 66b are formed in those portions of the inter-level insulation film 66 which lie on the drain and source regions 62 and 63. A drain electrode 67 is formed on the inter-level insulation film 66 and made in contact with the drain region 62 via the contact hole 66a. Likewise, a source electrode 68 is formed on the inter-level insulation film 66 and made in contact with the source region 63 via the contact hole 66b.

When an excessively high voltage is applied to the input pad and a potential applied to the drain of the input protection transistor with the construction shown in FIG. 1 becomes higher than the surface breakdown voltage of the junction plane between the drain region 62 and the substrate 60, breakdown occurs in the PN junction plane between the drain region (N+-type impurity diffused layer) 62 and the P-type substrate 60, causing a large number of holes 69 to be discharged from the drain region 62 into the P-type substrate 60. The holes 69 raise the potential of the P-type substrate 60, and when the potential thereof becomes higher than the ground potential Vss by the forward voltage drop across the PN junction between the P-type substrate 60 and the source region (N+-type impurity diffused layer) 63, the holes 69 flow into the source region 63. As a result, the input protection transistor acts as an NPN bipolar transistor and an excessively high voltage input from the exterior is discharged by the bipolar action.

Figure 2:
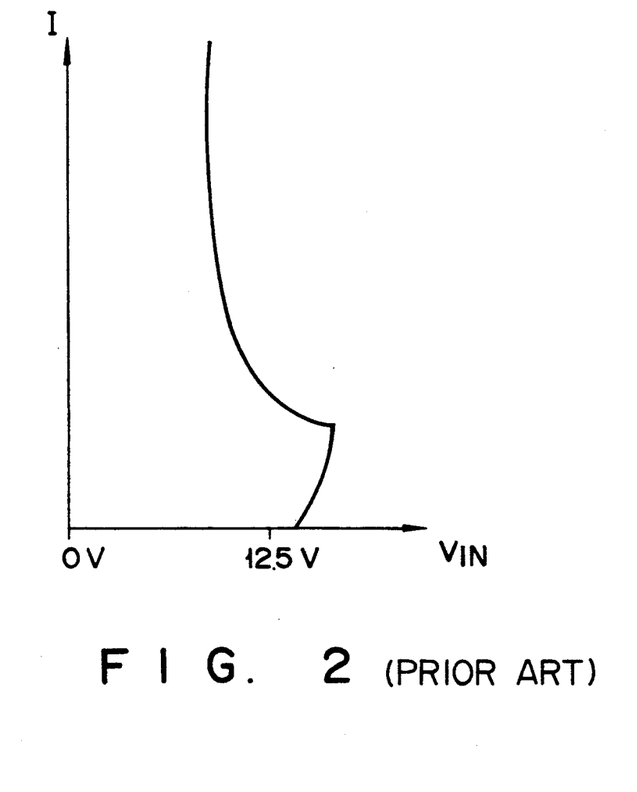
FIG. 2 is a diagram showing the input voltage-output current characteristic caused by the bipolar action of the input protection transistor shown in FIG. 1.

FIG. 2 shows the input voltage-output current characteristic obtained by the bipolar action of the input protection transistor. When the input voltage $V_{IN}$ is raised, the input protection transistor operates as an NPN bipolar transistor and is turned on so as to permit current to flow. If the bipolar transistor is once turned on, it maintains the ON-state even if the input voltage $V_{IN}$ is set lower than the turn-ON voltage.

Therefore, the gate voltage of the MOS transistor at the input stage (first stage) of the internal circuit is kept lower than the surface breakdown voltage of the junction plane between the substrate and the drain region of the input protection transistor so that an excessively high voltage can be prevented from being applied to the gate of the input-stage MOS transistor.

However, in recent years, in order to form the semiconductor integrated circuit device at a high integration density, elements constituting the internal circuit are formed in a fine pattern and the input protection elements are formed in a fine pattern. With the even greater miniaturization of the elements, the PN junction of the input protection transistor tends to be broken down by heat generated at the time of breakdown of the input protection transistor. The above problem occurs because heat generated in the junction plane is transmitted to aluminum forming the drain electrode 67 when the breakdown occurs at the PN junction plane between the P-type substrate 60 and the drain region 62 of the input protection transistor. When the temperature of aluminum is raised to the melting point of aluminum by the thus generated heat, aluminum at the contact portion with the drain region 62 melts and flows on the surface of the drain region 62 in a current flow direction. When the melted aluminum has reached the substrate 60, the drain region 62 is short-circuited to the substrate 60 and a state equivalent to a state in which the PN junction is broken down is set up.

The junction breakdown due to the melting of aluminum occurs before occurrence of the PN junction break-down due to concentration of electric field since the melting point of aluminum is low. For this reason, it is difficult to attain the greater miniaturization of elements and the high breakdown voltage of the PN junction at the same time.

There is a semiconductor integrated circuit device in which an input to an address input pin is required to be subjected to three-valued control, for example, in the electric signature test in an EPROM (ultraviolet erasable and programmable read only memory). The three-valued control is effected by controlling an input voltage by use of an ordinary high level (substantially the power source voltage level), low level (ground potential level) and a voltage level which is higher than the high level. In the case of the electric signature test, the high level is set at 5 V, the low level is set at 0 V and the voltage level higher than the high level is set at 12.5 V.

Assume now that noise is mixed into the input voltage in the electric signature test with the input voltage $V_{IN}$ set at a voltage of 12.5 V which is higher than the high level. For example, if the breakdown voltage of the NPN transistor is 14 V, the input voltage $V_{IN}$ becomes 14.5 V (12.5 V + 2 V) when noise of approximately 2 V is superposed on the input voltage, thereby turning on the input protection transistor (NPN transistor). Noise is superposed instantaneously and then the input voltage is returned to 12.5 V, but the NPN transistor which is once turned on permits current to continuously flow if the input voltage $V_{IN}$ is kept at 12.5 V as shown in FIG. 2. Current flowing in the NPN transistor which is set in the ON-state is large and heat generated at this time may cause the NPN transistor to be broken down. Further, a latch-up phenomenon may occur by a substrate current flowing at the time of turn-on of the NPN transistor.

The above explanation is made by taking an example of a case wherein a voltage higher than the high level is input in the electric signature test for EPROMs, but the above phenomenon may occur when an ordinary address is input if the surface breakdown voltage is lowered with the even greater miniaturization of elements. Particularly, the NPN transistor is turned on immediately after noise is superposed on the address input and overshooting of the address input has occurred, and the ON-state is maintained so that the NPN transistor may be damaged.

As described above, the conventional input protection circuit permits current to continuously flow at the time of breakdown of the input protection transistor by reduction in the surface breakdown voltage due to the even greater miniaturization of elements and the PN junction of the input protection transistor tends to be broken down by heat caused by the current. Further, a latch-up phenomenon tends to occur by the substrate current flowing when the input protection transistor is turned on.

SUMMARY OF THE INVENTION

Accordingly, a first object of this invention is to provide an input protection circuit capable of securely protecting an internal circuit even if the surface breakdown voltage is lowered with the even greater miniaturization of elements.

A second object of this invention is to provide an input protection circuit capable of preventing a large current from continuously flowing in the input protection element and suppressing damage of the input protection element and occurrence of a latch-up phenomenon when an input voltage is lowered after the input protection element is broken down.

The above objects of this invention can be attained by an input protection circuit comprising an input protection resistor having a first impurity diffused region of a second conductivity type formed in a semiconductor substrate of a first conductivity type and a second impurity diffused region of the second conductivity type which is formed in the first impurity diffused region to have an impurity concentration higher than the first impurity diffused region and have a diffusion depth smaller than the first impurity diffused region; and an input protection element provided between a signal path from the input protection resistor to an internal circuit and at least one of a ground terminal and a power source.

With the above construction, when a voltage which is not excessively high is input, the input protection resistor functions as a current limiter and the waveform of the input voltage is made dull by the input protection resistor, thereby making it possible to protect the internal circuit. At this time, the input protection element is not operated. Since the second impurity diffused region having a high impurity concentration and mainly functioning as a protection resistor section is formed in the first impurity diffused region of low impurity concentration to have a diffusion depth smaller than that of the first impurity diffused region, the surface breakdown voltage of the junction surface between the first impurity diffused region and the substrate is high and the protection resistor section is protected from breakdown. Further, the input protection resistor can be formed to have a desired resistance and the design margin thereof can be made large.

When an excessively high voltage is input, the input protection element, for example, input protection transistor is turned on by the bipolar action thereof so as to permit the excessively high voltage to be discharged. At this time, since a voltage drop occurs in the input protection resistor, an input voltage necessary for keeping the input protection transistor in the ON-state becomes high. Therefore, in a case where noise is instantaneously superposed on the input voltage to cause the input protection transistor to be broken down and then the input voltage is lowered, the input protection transistor cannot be kept in the ON-state, thereby preventing a large current from continuously flowing in the input protection transistor. As a result, an amount of heat generated when the input protection transistor is turned on by the bipolar action thereof becomes small and therefore the PN junction of the input protection transistor can be protected from breakdown and the occurrence of a latch-up phenomenon caused by the substrate current at the turn-ON time of the input protection transistor can be prevented even if the surface breakdown voltage is lowered with the even greater miniaturization of elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 3:
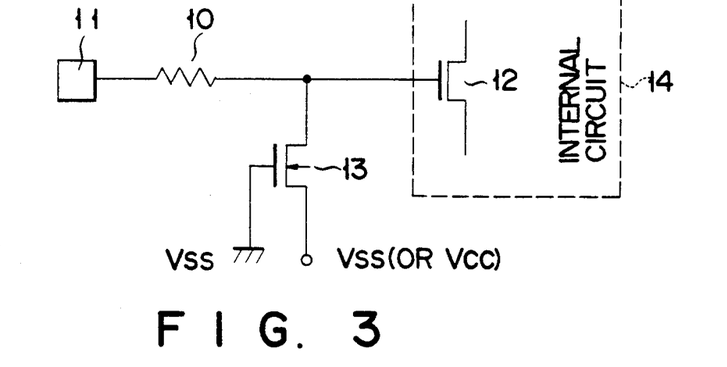
FIG. 3 is a circuit diagram of a portion near the input stage of a MOS LSI, for illustrating an input protection circuit according to a first embodiment of this invention.

FIG. 3 is a circuit diagram of a portion near the input stage of a MOS LSI, for illustrating an input protection circuit according to a first embodiment of this invention. The input protection circuit includes an input protection resistor 10 and an N-channel MOS transistor (input potential transistor) 13 serving as an input protection element. That is, one end of the input protection resistor 10 is connected to an input pad 11 to which an input signal is supplied from the exterior of the LSI and the other end of the input protection resistor 10 is connected to the gate of a MOS transistor 12 at the input stage (first stage) of an internal circuit 14. The drain of the input protection transistor 13 is connected to a signal path extending from the input protection resistor 10 to the the gate of the MOS transistor 12 and the source and gate of the transistor 13 are connected to a ground terminal Vss (the source thereof may be connected to a power source Vcc).

Figure 4:
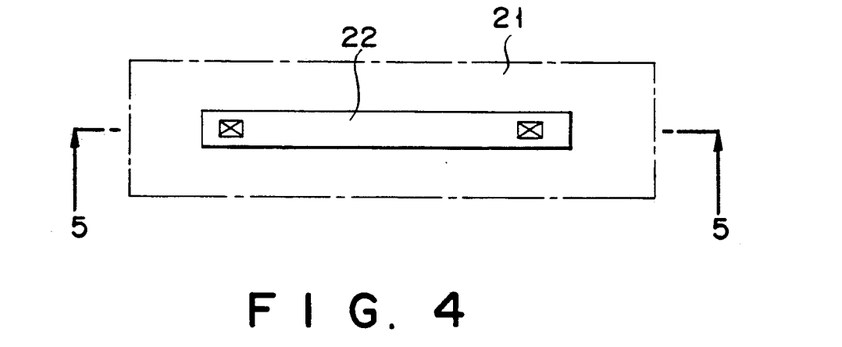
FIG. 4 is a plan view showing an example of the pattern construction of an input protection resistor of the circuit shown in FIG. 3.
Figure 5:
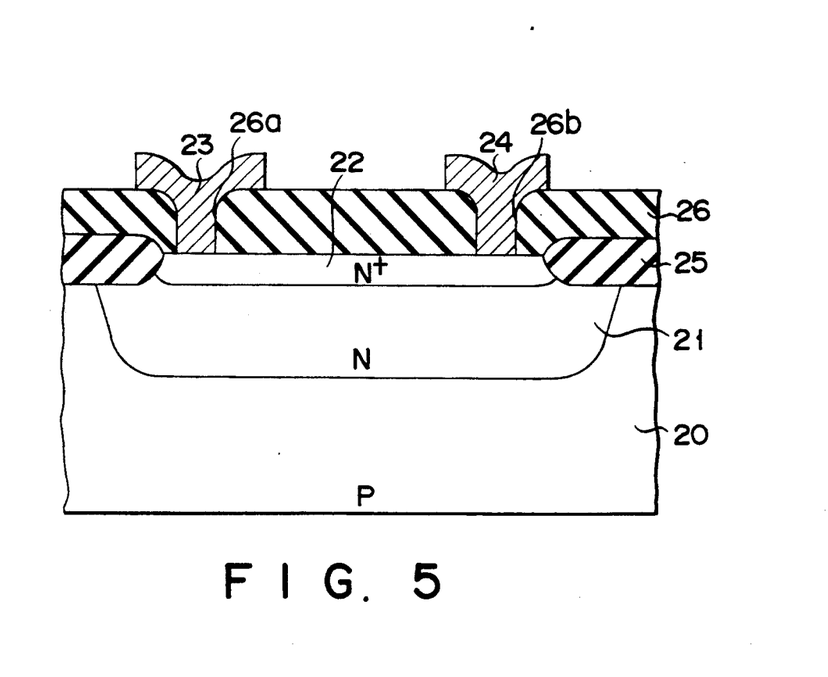
FIG. 5 is a cross sectional view of a pattern taken along the line 5—5 of FIG. 4.

The input protection resistor 10 is constructed as shown in FIGS. 4 and 5. FIG. 4 is a plan view showing an example of the pattern construction of the input protection resistor 10 of the circuit shown in FIG. 3, and FIG. 5 is a cross sectional view of the pattern taken along the line 5—5 of FIG. 4. A first impurity diffused region (N well region) 21 of N-type is formed in the main surface area of a P-type semiconductor substrate 20 which is isolated from the remaining by an element isolation region 25. A second impurity diffused region (N+-type impurity diffused layer) 22 having the same conductivity type as the region 21 and an impurity concentration higher than the region 21 is formed in the N well region 21. The second impurity diffused region 22 is formed with a diffusion depth smaller than that of the N well region 21. An inter-level insulation film 26 is formed on the element isolation region 25 and substrate 20. Contact holes 26a and 26b are formed in those portions of the insulation film 26 which lie on one and the other ends of the N+-type impurity diffused layer 22. Wirings 23 and 24 are formed on the insulation film 26. The wiring 23 is connected to the input pad 11 and formed in contact with one end of the diffused layer 22 via the contact hole 26a. The wiring 24 is connected to the drain of the input protection transistor 13 and the gate of the MOS transistor 12 in the internal circuit 14 and formed in contact with the other end of the diffused layer 22 via the contact hole 26b.

With the above construction, the N+-type impurity diffused layer 22 functions as the main portion of the input protection resistor 10. When the input protection resistor 10 is formed, the N well region 21 and the N+-type impurity diffused layer 22 can be formed by simply modifying the pattern without changing the ordinary MOS process. That is, the input protection resistor 10 can be formed by use of the manufacturing process for the internal circuit 14. For example, the well region 21 may be formed at the same time as formation of the well region for forming the P-channel MOS transistor constituting the internal circuit 14 and the N+-type impurity diffused layer 22 may be formed at the same time as formation of the source and drain regions of the N-channel MOS transistor constituting the internal circuit 14. For example, the N well region 21 may be formed by diffusing phosphorus as impurity and the N+-type impurity diffused layer 22 can be formed by diffusing arsenic as impurity.

Figure 6:
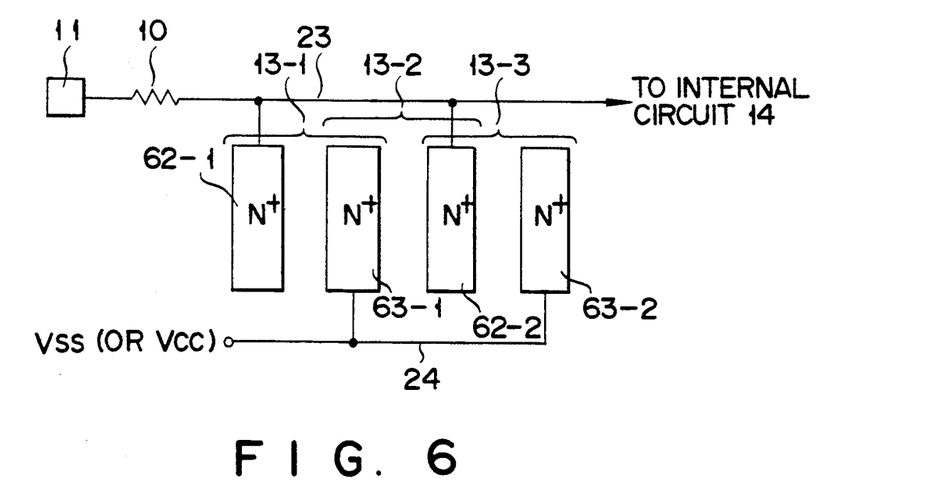
FIG. 6 is a plan view showing an example of the pattern construction of an input protection transistor of the circuit shown in FIG. 3.

The input protection transistor 13 may be formed with the construction as shown in FIG. 1, but when it is formed with such a pattern plane construction as shown in FIG. 6, the protection effect can be further enhanced. N+-type impurity diffused layers serving as drains 62-1 and 62-2 and sources 63-1 and 63-2 are alternately arranged in parallel, the N+-type impurity diffused layers used as one type of regions (in this example, the drain regions 62-1 and 62-2) are connected to the wiring 23 which is connected to the input protection resistor 10 and the N+-type impurity diffused layers used as the other type of regions (in this example, the source regions 63-1 and 63-2) are connected to the ground terminal Vss (or power source Vcc). The gate electrode (not shown) formed over the portion of the substrate which lies between the source and drain regions with an insulation film disposed between the gate electrode and the substrate portion is connected to the ground terminal.

With the above pattern construction, three N-channel MOS transistors 13-1, 13-2 and 13-3 for input protection are formed to commonly have the source region 63-1 and the drain region 62-2. The MOS transistor 12 in the internal circuit 14 can be more reliably protected by the bipolar action of the input protection transistors 13-1, 13-2 and 13-3.

Next, the operation of the input protection circuit shown in FIGS. 3 to 6 is explained. When a voltage which is not excessively high is input to the input pad 11, the input protection resistor 10 functions as a current limiter and the waveform of the input voltage is made dull by the resistance component of the input protection resistor, thereby making it possible to protect the MOS transistor 12 by the input protection resistor. At this time, the input protection transistor 13 does not cause the bipolar action. When an excessively high voltage is input to the input pad 11, the input protection transistor 13 is turned on by the bipolar action thereof, thereby discharging the excessively high voltage. At this time, since a voltage drop occurs in the input protection resistor 10, an input voltage required for keeping the input protection transistor 13 in the ON-state becomes high. The input voltage-output current characteristic obtained by the bipolar action of the input protection transistor 13 as viewed from the input pad 11 is indicated by a solid line in FIG. 7. For comparison, the characteristic obtained by the bipolar action of the conventional input protection transistor is indicated by a broken line in FIG. 7.

Figure 7:
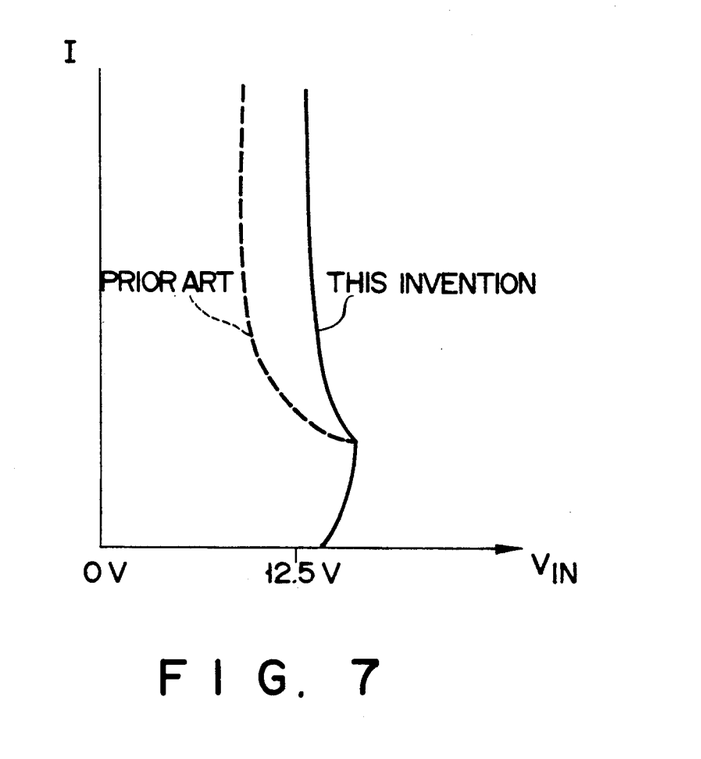
FIG. 7 is a diagram showing the input voltage-output current characteristic caused by the bipolar action of the input protection transistor in the circuit shown in FIG. 3.

Therefore, in a case where noise is instantaneously superposed on the input voltage to cause the input protection transistor 13 to be broken down and then the input voltage is lowered, the input protection transistor 13 cannot be kept in the ON-state, thereby preventing a large current to continuously flow therein. As a result, an amount of generated heat becomes small and therefore the PN junction of the input protection transistor 13 can be protected from being broken down and the occurrence of a latch-up phenomenon caused by the substrate current at the turn-ON time of the input protection transistor 13 can be prevented even if the surface breakdown voltage is lowered with the even greater miniaturization of elements.

In a case where the input protection resistor 10 is formed with the construction shown in FIGS. 4 and 5, the N+-type impurity diffused layer 22 mainly functions as the input protection resistor. Since the diffused layer 22 is surrounded by the N well region 21 of low impurity concentration, the surface breakdown voltage for the surface of the junction between the N well region 21 and the substrate 20 is high so that the diffused layer 22 may be difficult to be broken down even if an excessively high voltage is applied thereto. Further, the N+-type impurity diffused layer 22 can be formed to have a desired resistance by changing the impurity concentration thereof, and the design margin can be made large. The resistance of the N well region 21 is approximately 1 KΩ/□ and the resistance given only by the N well region becomes excessively large so that the characteristic such as access time of a semiconductor memory, for example, may be deteriorated.

When a polysilicon resistor is used as the input protection resistor, or when a resistor formed of only an N+-type impurity diffused layer is used, it is weak against the ESD breakdown and is broken down by the ESD stress before the input protection element so that it cannot satisfactorily function as the input protection resistor. This is because the polysilicon resistor is surrounded by the oxide film, it is difficult to radiate heat generated in the resistance component and the resistor is easily melted or fused by the ESD stress. Further, this is because when the ESD stress is applied to the N+-type impurity diffused resistor, heat caused by breakdown is generated at the contact between the input pad and the N+-type impurity diffused resistor, thereby breaking down the N+-type impurity diffused resistor.

Figure 8:
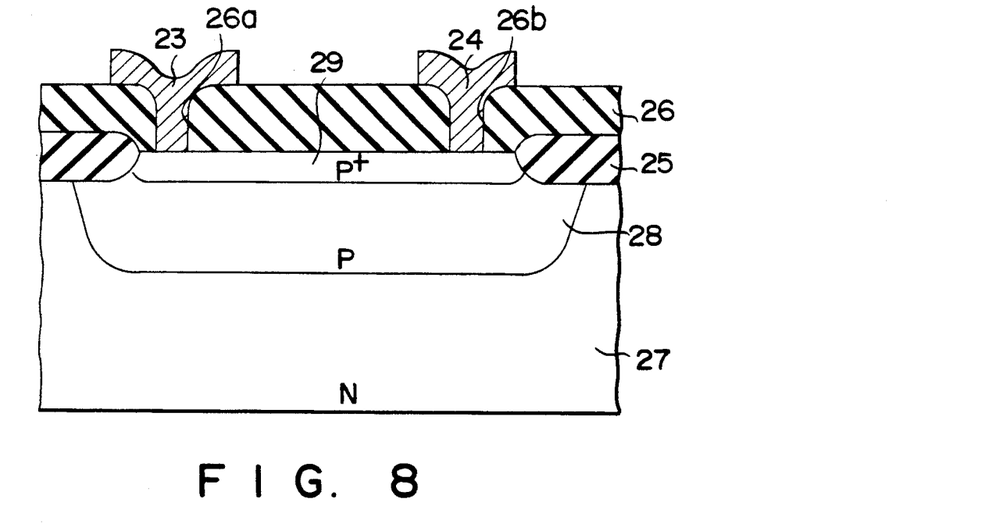
FIG. 8 is a cross sectional view showing another example of the construction of an input protection resistor of the circuit shown in FIG. 3.

This invention is not limited to the above embodiment and can be variously modified. For example, in the above embodiment, the semiconductor substrate is of P type, the first impurity diffused region is of N type and the second impurity diffused region is of N+ type. However, as shown in FIG. 8, even in a case where the conductivity type of each region is inverted, the same operation is effected and the same effect can be attained. When an N-type semiconductor substrate 27 is used, a P well region 28 which is the first impurity diffused region can be formed by diffusing boron with a relatively low impurity concentration and a P+-type impurity diffused layer 29 which is the second impurity diffused region can be formed by diffusing boron with a relatively high impurity concentration.

Figure 9:
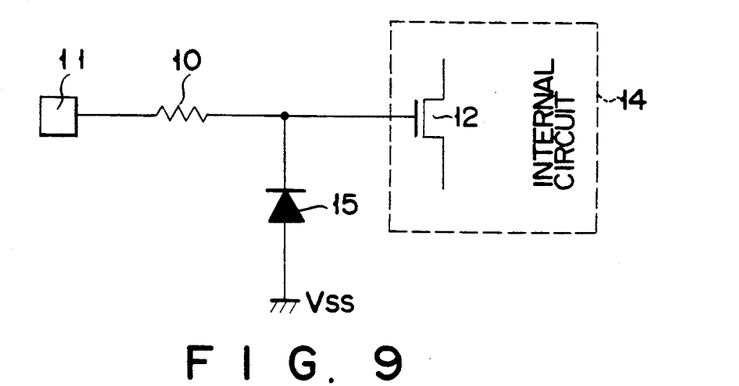
FIG. 9 is a circuit diagram of a portion near the input stage of a MOS LSI, for illustrating an input protection circuit according to a second embodiment of this invention.
Figure 10:
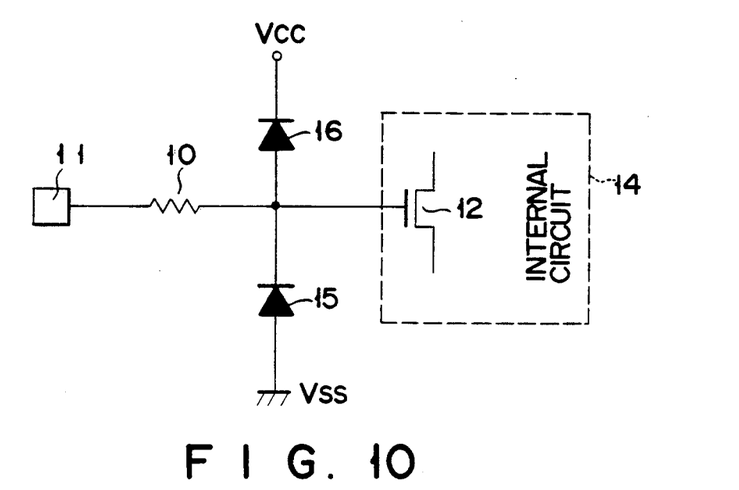
FIG. 10 is a circuit diagram of a portion near the input stage of a MOS LSI, for illustrating an input protection circuit according to a third embodiment of this invention.

FIG. 9 shows a portion near the input stage of a MOS LSI, for illustrating an input protection circuit according to a second embodiment of this invention. In the circuit of FIG. 1, the MOS transistor 13 is used as the input protection element, but in this embodiment in which a diode 15 is used as shown in FIG. 9, substantially the same operation as that of the input protection circuit shown in FIG. 1 can be effected and the same effect can be attained. Further, in FIGS. 1 and 9, the input elements are connected to the gate of the MOS transistor 12 and one of the ground terminal Vss and power source Vcc, but input protection elements (in this example, diodes 15 and 16) may be connected to both of them as shown in FIG. 10. With this construction, the MOS transistor 12 can be protected from positive and negative surge voltages applied to the input pad 11.

Figure 11:
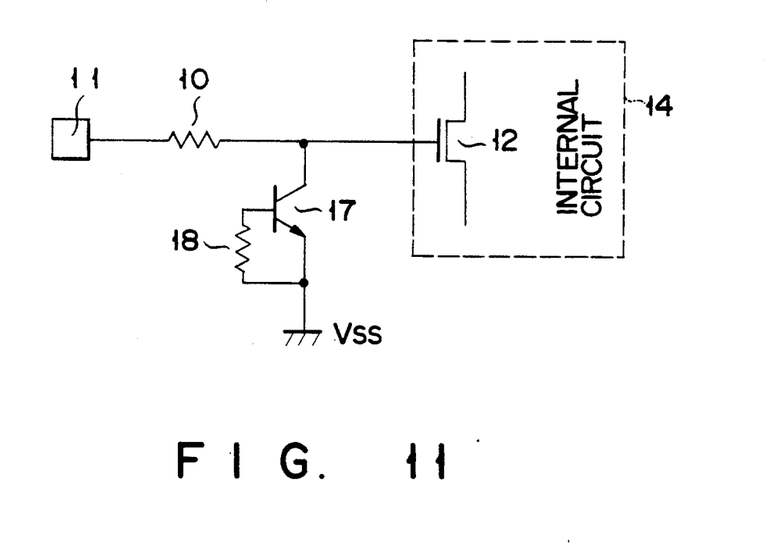
FIG. 11 is a circuit diagram of a portion near the input stage of a MOS LSI, for illustrating an input protection circuit according to a fourth embodiment of this invention.
Figure 12:
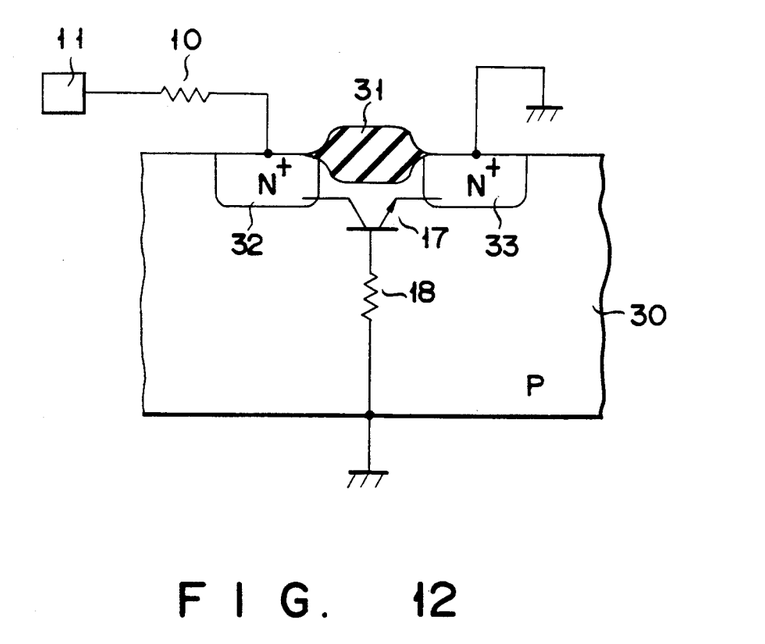
FIG. 12 is a cross sectional view showing an example of the construction of an input protection element of the circuit shown in FIG. 11.

FIG. 11 shows an input protection circuit according to a fourth embodiment of this invention. In this circuit, the input protection element is constructed by an NPN bipolar transistor 17 and a resistor 18. A field transistor shown in FIG. 12, for example, may be preferably used as the transistor 17 since it can be formed by use of the same manufacturing process for the internal circuit 14. A field insulation film 31 is formed on the main surface of a P-type semiconductor substrate 30. N+type impurity diffused layers 32 and 33 are formed in portions of the substrate 30 which lie on both sides of the field insulation film 31. The diffused layers 32 and 33 function as the collector and emitter regions of the transistor 17 and the P-type substrate 30 functions as the base region thereof. The resistor 18 is a substrate resistor.

Figure 13:
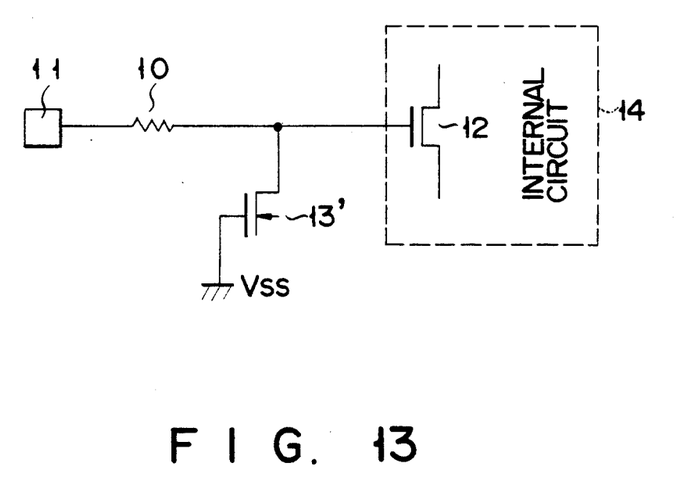
FIG. 13 is a circuit diagram of a portion near the input stage of a MOS LSI, for illustrating an input protection circuit according to a fifth embodiment of this invention.
Figure 14:
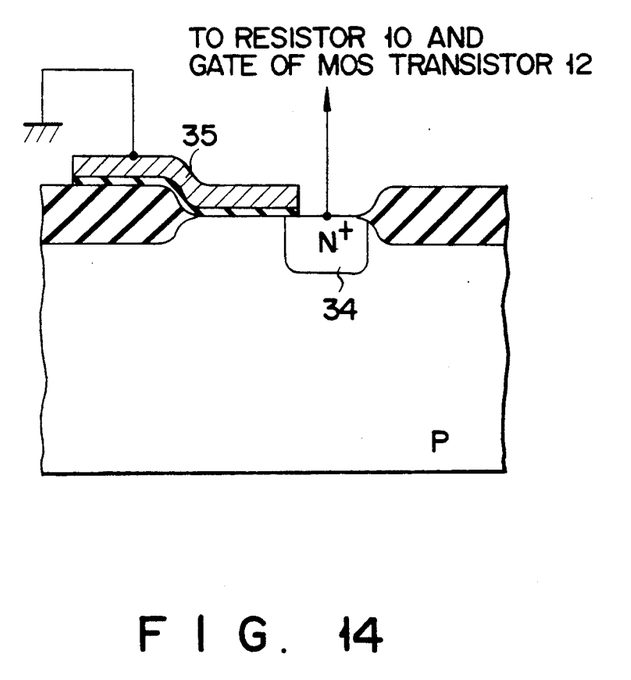
FIG. 14 is a cross sectional view showing an example of the construction of an input protection element of the circuit shown in FIG. 13.

FIG. 13 shows an input protection circuit according to a fifth embodiment of this invention. An input protection element 13' has a MOS transistor structure in which no source region is formed. As shown in FIG. 14, the element 13' has a drain region formed of an N+ type impurity diffused layer 34 and connected to the input protection resistor 10 and the gate of the MOS transistor 12 and a gate formed of a polysilicon layer 35 is connected to the ground terminal Vss.

With the constructions shown in the fourth and fifth embodiments, basically the same protection operation as that of the first to third embodiments can be effected and the same effect can be attained.

What is claimed is:
1. An input protection circuit, comprising:
   an input protection resistor comprising a first impurity diffused region of a second conductivity type in a semiconductor substrate of a first conductivity type and a second inpurity diffused region of the second conductivity type surrounded by said first impurity diffused region, said second impurity region having an impurity concentration higher than an impurity concentration of said first impurity diffused region and a diffusion depth smaller than a diffusion depth of said first impurity diffused region;
   a first wiring layer connecting an input pad to said second impurity diffused region;

a second wiring layer connected to said second impurity diffused region at a position spaced from said first wiring layer; and an input protection element connected between said second wiring layer and one of a ground terminal and a power source, wherein said second impurity diffused region functions as a main portion of said input protection resistor, and said first impurity diffused region functions to prevent a breakdown of said input protection resistor.

2. The input protection circuit according to claim 1, wherein said semiconductor substrate is of P type, said first and second impurity diffused regions are of N type, said first impurity diffused region is formed by diffusing phosphorus as impurity into said semiconductor substrate, and said second impurity diffused region is formed by diffusing arsenic as impurity into said first impurity diffused region.

3. The input protection circuit according to claim 1, wherein said semiconductor substrate is of N type, said first and second impurity diffused regions are of P type, said first impurity diffused region is formed by diffusing boron as impurity into said semiconductor substrate to low impurity concentration, and said second impurity diffused region is formed by diffusing arsenic as impurity into said first impurity diffused region to high impurity concentration.

4. The input protection circuit according to claim 1, wherein said input protection resistor is provided in a signal path extending from said input pad to a gate of a MOS transistor at an input stage of an internal circuit and said second wiring layer is connected to the gate of the MOS transistor at the input stage of said internal circuit.

5. The input protection circuit according to claim 4, wherein said input protection element includes an N-channel MOS transistor having a drain connected to said second wiring layer, a gate connected to said ground terminal, and a source connected to said ground terminal.

6. The input protection circuit according to claim 4, wherein said input protection element includes an N-channel MOS transistor having a drain connected to said second wiring layer, a gate connected to said ground terminal, and a source connected to said power source.

7. The input protection circuit according to claim 4, wherein said input protection element includes a diode having a cathode connected to said second wiring layer and an anode connected to said ground terminal.

8. The input protection circuit according to claim 4, wherein said input protection element includes a diode having an anode connected to said second wiring layer and a cathode connected to said power source.

9. The input protection circuit according to claim 4, wherein said input protection element includes a bipolar transistor having a collector connected to said second wiring layer, an emitter connected to said ground terminal, and a base, and a resistor connected between the base of said bipolar transistor and said ground terminal.

10. The input protection circuit according to claim 9, wherein said bipolar transistor includes a field transistor and said resistor includes a substrate resistor.

11. The input protection circuit according to claim 4, wherein said input protection element includes a third impurity diffusion region of the second conductivity type formed in the main surface area of said semiconductor substrate of the first conductivity type and a conductive layer over that portion of said semiconductor substrate which is adjacent to said third impurity diffused region with an insulation film disposed between the corresponding portion of said semiconductor substrate and said conductive layer, said third impurity diffused region connected to said second wiring layer and said conducive layer is connected to said ground terminal.

12. The input protection circuit according to claim 4, wherein said input protection element includes a plurality of N+-type impurity diffused regions which are separate from one another, one of the adjacent two of said plurality of N+-type impurity diffused regions connected to said second wiring layer and the other of said adjacent two N+-type impurity diffused regions connected to said ground terminal.

13. The input protection circuit according to claim 4, wherein said input protection element includes a plurality of N+-type impurity diffused regions which are separate from one another, one of the adjacent two of said plurality of N+-type impurity diffused regions connected to said second wiring layer and the other of said adjacent two N+-type impurity diffused regions connected to said power source.

14. The input protection circuit according to claim 1, wherein said second wiring layer is connected to an input stage of an internal circuit.

15. An input protection circuit for protecting a protected circuit from voltage surges in a signal at an input pad, said input protection circuit comprising:

an input protection resistor comprising a first region of a second conductivity type in a semiconductor body of a first conductivity type and a second region of the second conductivity type surrounded by said first region, said second region having an impurity concentration higher than an impurity concentration of said first region;

a first wiring layer coupling said input pad and said second region;

a second wiring layer coupled to said second region at a position spaced from said first wiring layer and coupling said second region to an input stage of said protected circuit; and an input protection element coupled between said second wiring layer and one of a ground terminal and a power source.

16. The input protection circuit according to claim 15, wherein said input protection element comprises:

an N-channel MOS transistor having a drain connected to said second wiring layer, a source connected to a ground potential, and a gate connected to a ground potential.

17. The input protection circuit according to claim 15, wherein said input protection element comprises:

a diode having an anode connected to said second wiring layer and a cathode connected to a power source potential.

18. The input protection circuit according to claim 15, wherein said input protection element comprises:

a bipolar transistor having a collector connected to said second wiring layer, an emitter connected to said ground potential, and a base; and a resistor connected between the base of said bipolar transistor and said ground potential.

19. A semiconductor device, comprising:

a semiconductor body of a first conductivity type;

an integrated circuit on said semiconductor body;

an input pad coupled to aid integrated circuit for receiving input signals; and an input protection circuit coupled to said input pad and said integrated circuit for protecting said integrated circuit from voltage surges in the input signals, said protection circuit an input protection resistor comprising a first region of a second conductivity type in said semiconductor body and a second region of the second conductivity type surrounded by said first region, said second region having an impurity concentration higher than an impurity concentration of said first region;

a first wiring layer coupling said input pad and said second region;

a second wiring layer coupled to said second region at a position spaced from said first wiring layer and coupling said second region to an input stage of said integrated circuit; and an input protection element coupled between said second wiring layer and one of a ground terminal and a power source.

* * * * *

UNITED STATES PATENT AND TRADEMARK OFFICE
CERTIFICATE OF CORRECTION

PATENT NO. : 5,181,092
DATED : January 19, 1993
INVENTOR(S) : SHIGERU ATSUMI

It is certified that error appears in the above-identified patent and that said Letters Patent is hereby corrected as shown below:

In claim 19, column 11, line 1, "aid" should be --said--

In claim 19, column 11, line 6, --comprising:-- should be inserted after "circuit".

Signed and Sealed this

Twenty-second Day of March, 1994

Attest:

BRUCE LEHMAN

*Attesting Officer*     *Commissioner of Patents and Trademarks*